United States Patent [19]

Stevens

[11] Patent Number: 5,049,880
[45] Date of Patent: Sep. 17, 1991

[54] BIT-WISE RUN-LENGTH ENCODING FOR DATA COMPRESSION

[75] Inventor: Douglas C. Stevens, Portland, Oreg.

[73] Assignee: Tektronix, Inc., Beaverton, Oreg.

[21] Appl. No.: 503,009

[22] Filed: Apr. 2, 1990

[51] Int. Cl.5 ............................................. H03M 7/46
[52] U.S. Cl. ........................................ 341/63; 341/81
[58] Field of Search ............... 341/60, 63, 81, 87, 341/95

[56] References Cited

U.S. PATENT DOCUMENTS

| 3,984,833 | 10/1976 | Van Voorhis | 341/63 |
| 4,327,379 | 4/1982 | Kadakia | 341/60 |
| 4,494,151 | 1/1985 | Liao | 341/63 |
| 4,610,027 | 9/1986 | Anderson et al. | 341/63 |
| 4,701,745 | 10/1989 | Waterworth | 341/63 |
| 4,811,113 | 3/1989 | Ozeki et al. | 341/63 |

Primary Examiner—A. D. Pellinen
Assistant Examiner—Marc S. Hoff
Attorney, Agent, or Firm—John Smith-Hill; Francis I. Gray

[57] ABSTRACT

A method of compressing a digitized waveform into a sequence of N-bit words includes selecting corresponding bit values from N data words and generating a value based thereon. A next N input words are selected and the corresponding bits are used to generate a next value. The process is continued for each significant bit of the input sequence and the generated value stream is run-length encoded to produce a compressed data output stream.

16 Claims, 6 Drawing Sheets

BIT-WISE RUN-LENGTH ENCODING FOR DATA COMPRESSION

This invention relates to compressing and decompressing a sequence of digital data values.

BACKGROUND OF THE INVENTION

Current methods of compressing data involve trade offs between speed, compression ratio, and complexity; the data structures required for compression methods can be complex and require substantial computational and storage overhead. Some compression methods require that an entire collection of data be available in a single block of data and the data must be stable while compression is being performed. Other compression methods can produce output which requires greater storage space than would the uncompressed data, thereby rendering the compression effort wasted. Still other compression processes result in compromises between accurate data representation and compression ratio.

One method of compressing data is run-length encoding, which does not present the problem of compressed data size exceeding input data size. However, many forms of input data will not result in significant compression because they have long sections with no repeated values. For example, a ramp will not compress well with a run-length encoding scheme. Further, noise can seriously interfere with run-length encoded compression when data resolution is greater than 10 bits, unless the algorithm is modified to run-length encode nearly identical values as being equal. Such modification results in a non-identical reconstruction of the original data when compressed data is uncompressed.

Another compression method is a quadtree; a square two dimensional array is recursively compressed by (1) if array size is one, representing the array as a single non-compressed value, (2) otherwise, if all values in the array are near-same, representing the array as a single compressed value and (3) otherwise, dividing the array into four subarrays and compressing each of the subarrays. Drawbacks to this method include requiring the array to be stable during compression and requiring the entire array to be available in a single block of memory. Further, the data structures involved are complex and require computational and storage overhead, some arrays will compress to a form requiring greater storage space than the original uncompressed array and a compromise must be made between compression ratio and faithful reproduction of the input data upon decompression.

The Limpel-Ziv-Welch (LZW) algorithm, as described in "A Technique for High-Performance Data Compression" in IEEE Computer, June 1984, pages 8-19 compresses data which will tend to have repeated sequences. The algorithm creates a dictionary while processing data, creating single-word codes for repeated sequences. A drawback to such an algorithm is that the data word size of the compressed sample must exceed the data word size of the original non-compressed data. Further, input data which is near-random will compress poorly and system memory requirements may be large, as memory sufficient to hold the generated dictionary and a LIFO stack for decompression will be required. As with other methods, data sequences which are near-random will compress poorly.

Thus, it would be desirable to have a compression method which will faithfully compress near-random or high frequency input data and will identically reconstruct the input data when decompressed, while still being simple to implement, with reasonable compression ratios and low memory space requirements.

SUMMARY OF THE INVENTION

According to the present invention, a method of compressing a sequence of digital data values $X_0, X_1, \ldots X_{N-1}, X_N, X_{N+1}, \ldots X_M$, wherein N and M are integers and M is a multiple of N, each data value comprising Y data bits, comprises the steps of:

(a) selecting a first bit from each of $X_0, X_1, \ldots X_{N-1}$;

(b) assembling the N bits to generate a N-bit data word;

(c) comparing the generated data word with a previously generated data word and incrementing a repeat count if the compared words are the same;

(d) saving a repeat sequence if the result of the comparison indicates that the previous generated data word and the current generated data word are not equal and setting the previous generated data word to be equal to the currently generated data word, and setting the repeat count equal to one;

(e) repeating steps a through d for all remaining data values in the sequence; and (f) repeating steps a through e for each of the Y bits.

The present invention thus provides a method for compressing a sequence of data values.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
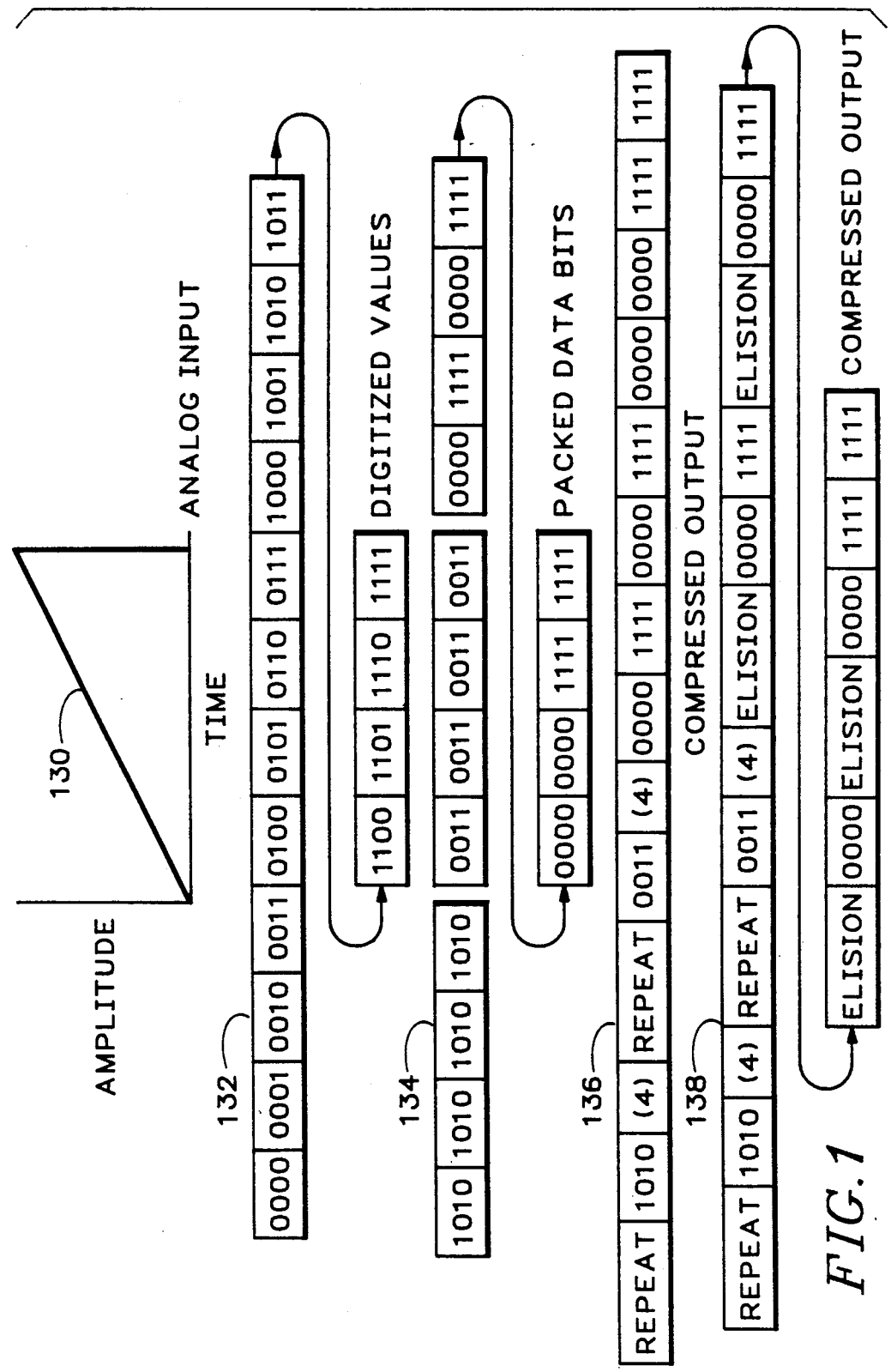
FIG. 1 is an illustration of the operation of the present invention on a ramp input signal.

FIG. 1 illustrates the operation of the present invention on a ramp input signal. With a ramp, the least-significant bit may continually change its state from one sample value to the next, but the most-significant bit will change value only once during the ramp; therefore, given the long sequences of repeated bit values in the most-significant bit, a better compression will result with the present invention than would occur using a sample-by-sample run-length encoding scheme of the prior art. The input ramp waveform 130 shown in FIG. 1 would produce a sequence of digitized values 132 (assuming a four-bit word size) as follows: 0000, 0001, 0010, 0011, 0100, 0101, 0110, 0111, 1000, 1001, 1010, 1011, 1100, 1101, 1110, and 1111.

Packed output sequence 134 is generated from the selection of bit values from each input value. Selecting the least-significant bit from each entry, and grouping into data word sizes of four bits, would produce the following values: 1010, 1010, 1010, and 1010; selecting and grouping the next significant bit would produce the following values: 0011, 0011, 0011, 0011; selecting and grouping the next significant bit would produce the following data values: 0000, 1111, 0000, 1111, and selecting and grouping the most-significant bit would produce the following data values: 0000, 0000, 1111, and 1111.

Now, run-length encoding the generated data words, the compression method of the present invention will produce output data sequence 136, wherein REPEAT indicates a repeat marker and a numerical value in parentheses represents a repeat count: REPEAT, 1010, (4), REPEAT, 0011, (4), 0000, 1111, 0000, 1111, 0000, 0000, 1111, 1111. Thus, it can be seen that the original input sequence of sixteen data words has been compressed to a sequence of fourteen data words. While the example herein shows a sixteen data word input sequence, it may be appreciated that an extended sequence of input data words will result in greater compression, especially given a signal wherein the most significant bit changes less frequently than in the example shown herein.

In order to interpret the data sequence 136, framing information is needed; that is, some information must be included to indicate which bits are being stored in the output sequence. One method of achieving this is to generate a word before each data stream to indicate which bit number is to follow. As the total data stream length may be in the hundreds of kilobytes, the effect on the compression ratio is negligible. An alternate method of providing framing information would be to indicate the total number of samples in the data stream, and when decompressing, divide the number of samples by the number of bits per sample and break up the stream accordingly.

In the illustrated example, REPEAT has been chosen so as to not correspond to any of the input data values. If, however, the repeat marker did have a value equal to that of one of the input data values, the compressed output would be modified. For example, if REPEAT were chosen to be 0000, the compressed output sequence 138 would be generated from input sequence 132 as follows: REPEAT, 1010, (4), REPEAT, 0011, (4), ELISION, 0000, 1111, ELISION, 0000, 1111, ELISION, 0000, ELISION, 0000, 1111, 1111, where ELISION is chosen to have the value 0101 and is a mark that indicates that the data word immediately following the elision should not be interpreted as a repeat marker or elision mark. Therefore, it can be seen that the REPEAT and ELISION marks should be chosen carefully to avoid excessive insertion of extra data words.

Figure 3A:
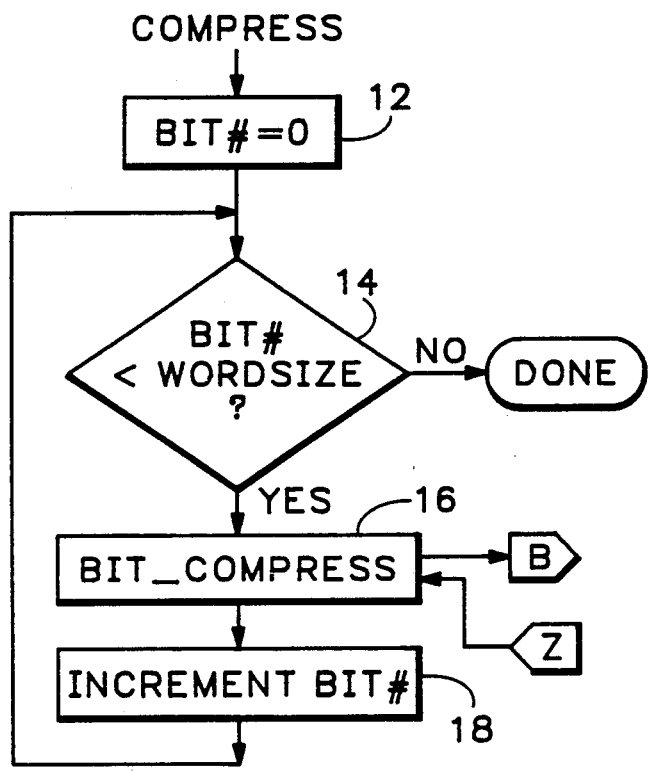
FIGS. 3A through 3E are flow charts of the operation of the present invention.

Referring to FIG. 3A, a sequence of digital data values which may represent, for example, a video input signal, is provided to a processor. To compress the data, the processor sets a BIT NUMBER to zero (step 12) wherein BIT NUMBER represents the number of the bit currently being processed. BIT NUMBER is tested to determine whether BIT NUMBER is less than WORDSIZE, where WORDSIZE represents the word size (number of bits) of the values used to transmit or store compressed data (block 14). If BIT NUMBER is greater than or equal to WORDSIZE, the process is done, otherwise, if BIT NUMBER is less than WORDSIZE, the routine will continue execution with block 16, the "bit compressing" function, which will be discussed in greater detail in reference to FIG. 3B, and then will increment BIT NUMBER in block 18. The operation will loop back to the "test BIT NUMBER" block 14 and continue moving through the test, compress and increment loop until the result of the "test BIT NUMBER" block 14 indicates that BIT NUMBER is not less than WORDSIZE. The operation will then be completed.

Figure 3D:
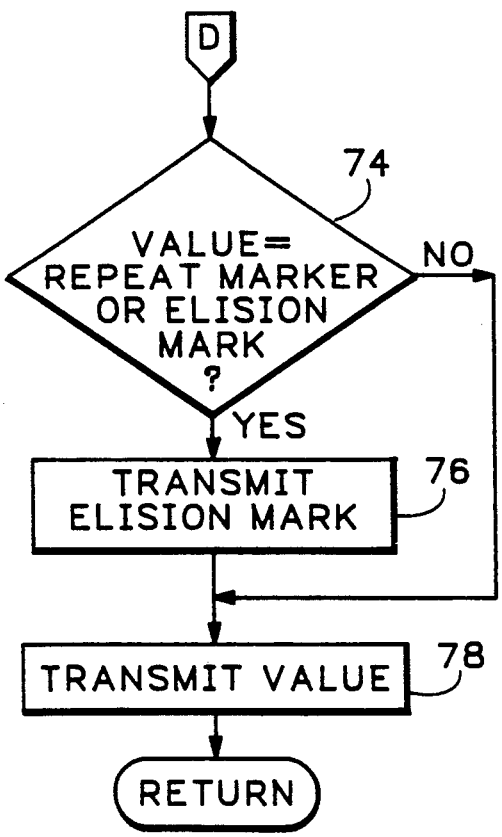
Figure 3B:
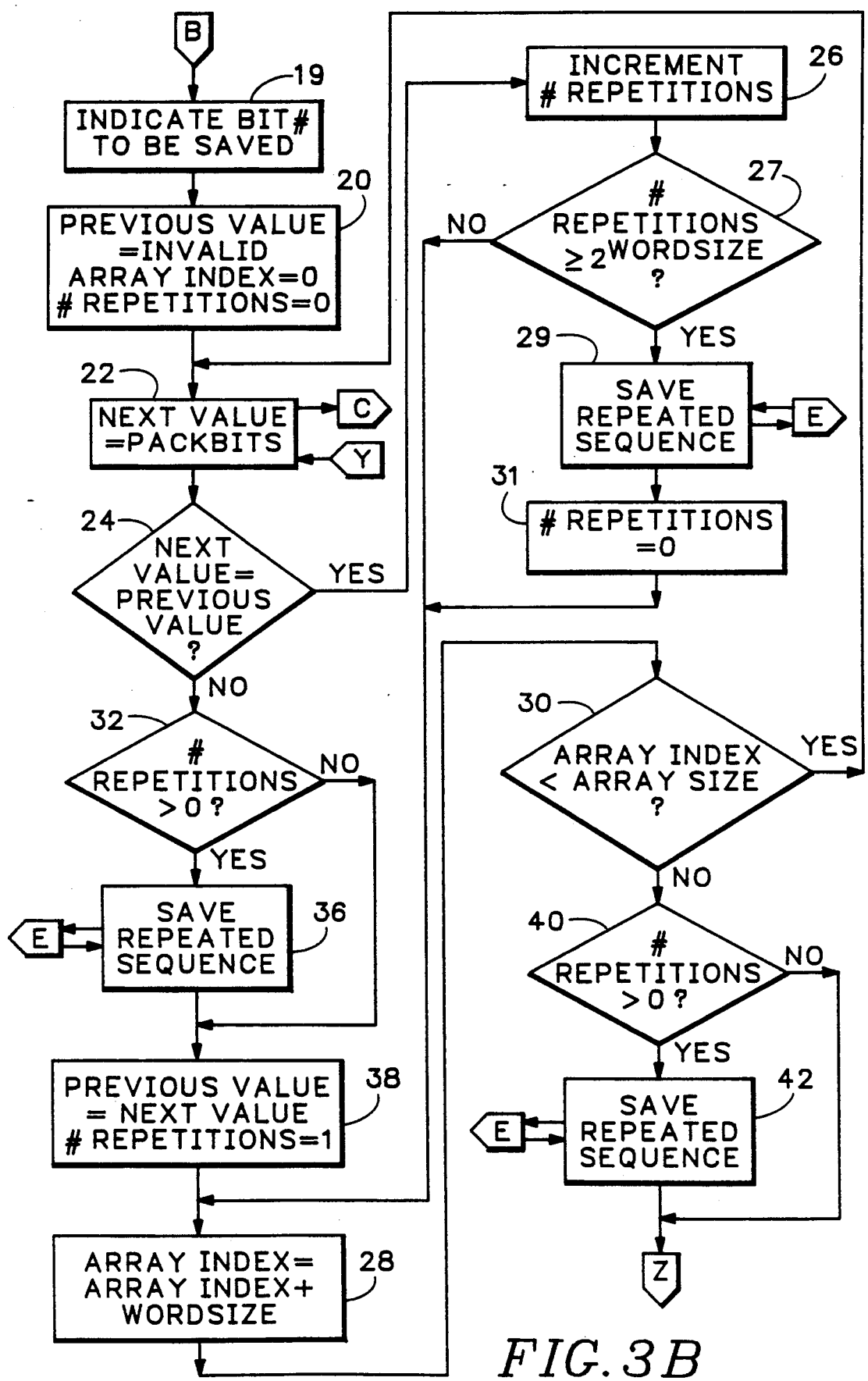

Referring now to FIG. 3B, the "bit compressing" function will be discussed. Block 19 indicates the bit number which will be sent to an apparatus receiving the compressed data, thereby providing framing information. To initialize the compressing function, a PREVIOUS VALUE, which stores the value generated by a previous iteration of the process, is set to be an invalid value, an ARRAY INDEX, which indicates the current location of the input array being processed, is set to zero and a NUMBER OF REPETITIONS counter, which keeps track of the number of times that a particular generated data value is repeated, is also set to zero, all in block 20. The setting of PREVIOUS VALUE to an invalid value could be accomplished by setting a flag to indicate that the current data stored in PREVIOUS VALUE is invalid. Setting PREVIOUS VALUE to be invalid could also be accomplished, for example, by using a data word size for PREVIOUS VALUE which is greater than the input data word size and setting a high bit on PREVIOUS VALUE; since input data would never have that bit set, PREVIOUS VALUE is then guaranteed to be an invalid value.

Next, a NEXT VALUE, which stores the currently generated data value, is set equal to the value returned by the "pack bits" function, which will be discussed in conjunction with FIG. 3C (block 22). Then, decision block 24 tests NEXT VALUE to see if it is equal to PREVIOUS VALUE. If NEXT VALUE is equal to PREVIOUS VALUE, NUMBER OF REPETITIONS is incremented, block 26, NUMBER OF REPETITIONS is tested to see if it is greater than or equal to two raised to the power of WORDSIZE (thereby ensuring the count does not exceed the value which may be stored in a data word of size WORDSIZE). If NUMBER OF REPETITIONS is greater than or equal to two raised to the power of WORDSIZE, the process saves a repeated sequence (block 29) as will be discussed in conjunction with FIG. 3E, and NUMBER OF REPETITIONS is set equal to zero (block 31). If NUMBER OF REPETITIONS is not greater than or equal to two raised to the power of WORDSIZE, blocks 29 and 31 are skipped. Next, ARRAY INDEX is set equal to ARRAY INDEX plus WORDSIZE (block 28), and ARRAY INDEX is tested to see if it is less than the ARRAY SIZE, where ARRAY SIZE represents the number of data words in the input data array, in block 30. If the comparison of ARRAY INDEX to ARRAY SIZE indicates that ARRAY INDEX is less than ARRAY SIZE, the process will loop back to block 22 and begin processing more data. If decision block 24 indicates that NEXT VALUE is not equal to PREVIOUS VALUE, then the process will enter decision block 32 wherein NUMBER OF REPETITIONS will be tested against zero. If NUMBER OF REPETITIONS is not greater than zero, PREVIOUS VALUE will be set equal to NEXT VALUE and NUMBER OF REPETITIONS will be set equal to one in block 38 and the process will then enter block 28 and continue as described above in reference to block 28. If, however, NUMBER OF REPETITIONS is greater than zero, then the process will save a repeated sequence (block 36), as will be discussed in relation to FIG. 3E, and continue with block 38 followed by block 28 as described above.

Referring again to decision block 30, if ARRAY INDEX was not less than ARRAY SIZE, decision block 40 is entered wherein the NUMBER OF REPETITIONS is tested against zero; if NUMBER OF REPETITIONS is greater than zero, the process will save a repeated sequence (block 42), as will be discussed in conjunction with FIG. 3E, and will then return to continue execution with block 18 in FIG. 3A. If, on the other hand, in decision block 40 the NUMBER OF REPETITIONS is not greater than zero, the process will simply return to execution in FIG. 3A without any further processing.

Figure 3C:
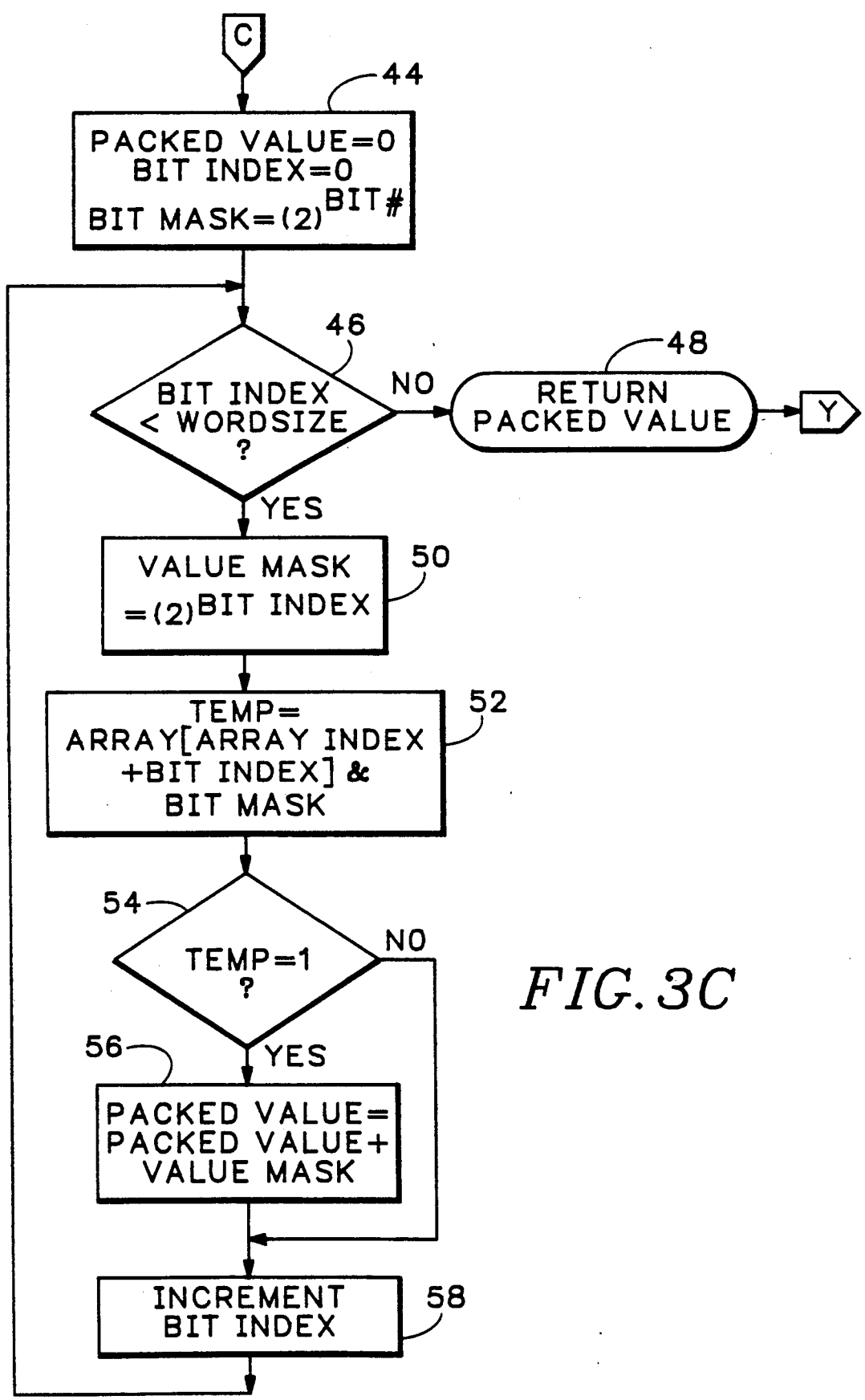

Referring now to FIG. 3C, the bit packing process may now be better understood. The process is entered from block 22 of FIG. 3B and begins by setting a PACKED VALUE and a BIT INDEX to zero, and a BIT MASK to be equal to two raised to the power of BIT NUMBER (block 44). BIT INDEX is then tested in decision block 46 to determine whether it is less than WORDSIZE and if it is, the process returns PACKED VALUE to block 22 of FIG. 3B wherein the returned value is assigned to the NEXT VALUE (block 48). If BIT INDEX is less than WORDSIZE, then step 50 is executed wherein a VALUE MASK is set equal to the value of two raised to the power of BIT INDEX and in block 52, a temporary value (TEMP) is set equal to the value stored in the ARRAY INDEX plus BIT INDEX array entry, bit-wise anded with BIT MASK (step 52). Then the temporary value is tested in block 54 and if equal to one, PACKED VALUE is set to be equal to PACKED VALUE plus VALUE MASK (block 56). BIT INDEX is then incremented in block 58 and the process loops back to enter decision block 46 wherein BIT INDEX is tested against WORDSIZE. If temporary value is not equal to one in decision block 54, the process will skip block 56 and continue execution with the increment BIT INDEX block 58.

Figure 3E:
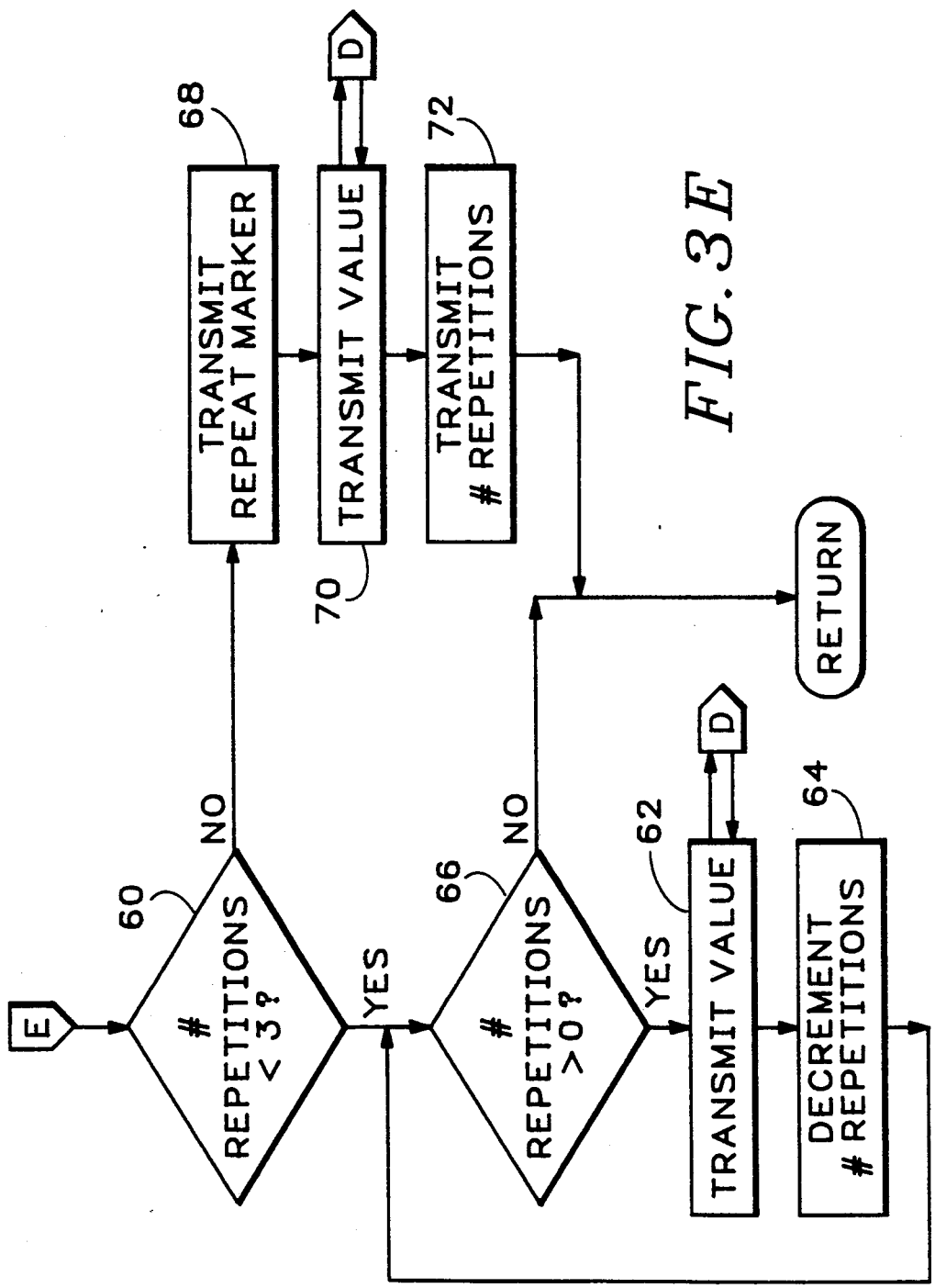

FIG. 3E illustrates the operation of the save repeated sequence process, wherein NUMBER OF REPETITIONS is compared against three in decision block 60 and if less than three, NUMBER OF REPETITIONS is compared against zero (decision block 66). If NUMBER OF REPETITIONS is not greater than zero, the process will return, but if greater than zero, the "transmit value" process 62, which will be discussed with reference to FIG. 3D, is entered wherein PREVIOUS VALUE (FIG. 3B) is stored or transmitted. NUMBER OF REPETITIONS is then decremented (block 64) and the process will loop back and continue execution with decision block 66. If, in decision block 60, NUMBER OF REPETITIONS is not less than three, then the process will transmit a repeat marker, block 68, to indicate that the data following represents compressed information. The value which is compressed (PREVIOUS VALUE from FIG. 3B) is then transmitted in block 70, which corresponds to FIG. 3D, NUMBER OF REPETITIONS, as determined in FIG. 3B, is transmitted (block 72) and the process then returns. Thus, in operation, it can be seen that a sequence of fewer than three repeated characters will be saved without compression, since compression requires a minimum of three data words and compressing repeats of less than three values would expand rather than reduce the amount of output data.

Referring to FIG. 3D, the "transmit value" process begins with the step of comparing the value to be transmitted with the repeat marker or the elision mark (decision block 74). If the value is equal to either mark, then an elision mark is transmitted (block 76) and then the value to be transmitted is sent (block 78), whereupon the process returns to the appropriate point of FIG. 3E. If the value to be transmitted is not equal to the repeat marker or the elision mark in block 74, then the process skips the transmit elision mark block 76 and proceeds with execution at the "transmit value" block 78. The test for a repeat marker or elision mark thus allows the insertion of an elision mark followed by the repeat or elision mark to insure that the occurrence of the data values which are the same values as the chosen repeat and elision marks are not falsely interpreted in the decompression process. Since the occurrence of repeat or elision mark as data will result in an extra data word being stored, the repeat and elision marks should be chosen to be data word values which occur infrequently to minimize storage of extra data words, if such a selection is possible. For digitized analog waveforms, the choice of elision and repeat marks to be such that they have alternating bit patterns of zeros and ones appears to be desirable, since those patterns will occur less frequently than other patterns; the most frequently occurring patterns, and therefore the least desirable choices for elision and repeat marks, are all-zeros and all-ones.

In operation, the input data sequence 132 of FIG. 1 would be processed as follows (data values are in binary representation): BIT NUMBER would be set to 0000 (block 12 FIG. 3A) and would then be tested against WORDSIZE (block 14). In this example, WORDSIZE is four (0100), therefore BIT NUMBER is less than WORDSIZE so the bit compress function (FIG 3B) is entered. Bit zero is being processed, so block 19 indicates that bit zero will be saved. Block 20 sets PREVIOUS VALUE to be invalid, ARRAY, INDEX to 0000, and NUMBER OF REPETITIONS to 0000. Then, pack bits (FIG. 3C) is entered, wherein PACKED VALUE is set to 0000, BIT INDEX is set of 0000, and BIT MASK is set to two raised to the BIT NUMBER power. Thus, BIT MASK is 0001 (00100). BIT INDEX (0000) is now tested against WORDSIZE (0100) and is less, so VALUE MASK is set to be two to the power of BIT INDEX (00100=0001). A temporary value is set to ARRAY[ARRAY INDEX+BIT INDEX] (ARRAY(0000+0000]=0000, the bit zero value from the first entry in ARRAY) anded with BIT MASK (0000&0001=0000). Then TEMP is tested against one, and the test fails, so BIT INDEX is incremented (block 58), leaving BIT INDEX with a value of 0001. Looping back, to block 46, BIT INDEX (0001) is tested against WORDSIZE (0100) and since it is less, block 50 is entered wherein VALUE MASK is set to be two raised to the power of BIT INDEX (00100001=0010). TEMP will then be set to ARRAY[0000+0001] anded with BIT MASK. Array [0001] is 0001 (see FIG. 1), so TEMP=0001 &0001=0001. In decision block 54, TEMP is equal to one, so block 56 is entered wherein PACKED VALUE (currently zero) is set to PACKED VALUE+VALUE MASK (0000+0010=0010). Now, BIT INDEX is incremented (0010) in block 58 and the loop continues, testing against WORDSIZE. Since BIT INDEX is still less than WORDSIZE, VALUE MASK is set to two raised to the power of BIT INDEX (00100010=0100) and TEMP is set to ARRAY[0000+0010] (a value of 0010) anded with BIT MASK (0010&0001=0000). Since TEMP is zero, step 56 is skipped, BIT INDEX is incremented (now 0011) and the process loops back to decision block 46. BIT INDEX is still less than WORDSIZE, so VALUE MASK is set 1000 (0010 0011) and TEMP is set to one MASK is set 1000(00100011) and TEMP is set to one MASK)). Since TEMP is one, block 56 is entered wherein PACKED VALUE (currently 0010) is set to 1010 (PACKED VALUE+VALUE MASK). BIT INDEX is incremented to 0100, and in decision block 46, BIT INDEX is not less than WORD SIZE, so PACKED VALUE is returned (1010) to block 22 of FIG. 3B.

NEXT VALUE is then set to the returned PACKED VALUE and compared against PREVIOUS VALUE in block 24. Since PREVIOUS VALUE is currently invalid, the comparison fails and block 32 is entered, where NUMBER OF REPETITIONS (currently 0) is tested to see if greater than zero. Since it is not greater, block 38 is entered where NUMBER OF REPETITIONS is set to one, and PREVIOUS VALUE is set to NEXT VALUE (1010). ARRAY INDEX (currently zero) is then set to ARRAY INDEX+WORDSIZE (0000+0100=0100) in block 28 and ARRAY INDEX is tested to see if less than ARRAY SIZE (it is, since ARRAY SIZE is sixteen in this example). The process loops back to block 22 and continuous packing the bits, thus generating the first four entries of packed data bits 134 of FIG. 1. Once the ARRAY INDEX is not less than ARRAY SIZE in decision block 30, NUMBER OF REPETITIONS (currently four) is tested against zero, and if greater (as it is in this example), the "save repeated sequence" block 42 is entered.

Referring to FIG. 3E, save repeated sequence operates as follows: NUMBER OF REPETITIONS (currently four) is tested, and since it is not less than 3, block 68 transmits a repeat marker corresponding to the first "REPEAT" of compressed output 136 of FIG. 1. Block 70 transmits the data value (1010) corresponding to the second entry of compressed output array 136 and block 72 transmits the NUMBER OF REPETITIONS corresponding to the third entry of compressed output array 136. The process then returns to begin executing with block 18 of FIG. 3A wherein BIT NUMBER is incremented. Having incremented BIT NUMBER, the above described process is then repeated and the subsequent bit values in the input data array 132 are processed, generating the compressed output array 136.

Figure 2:
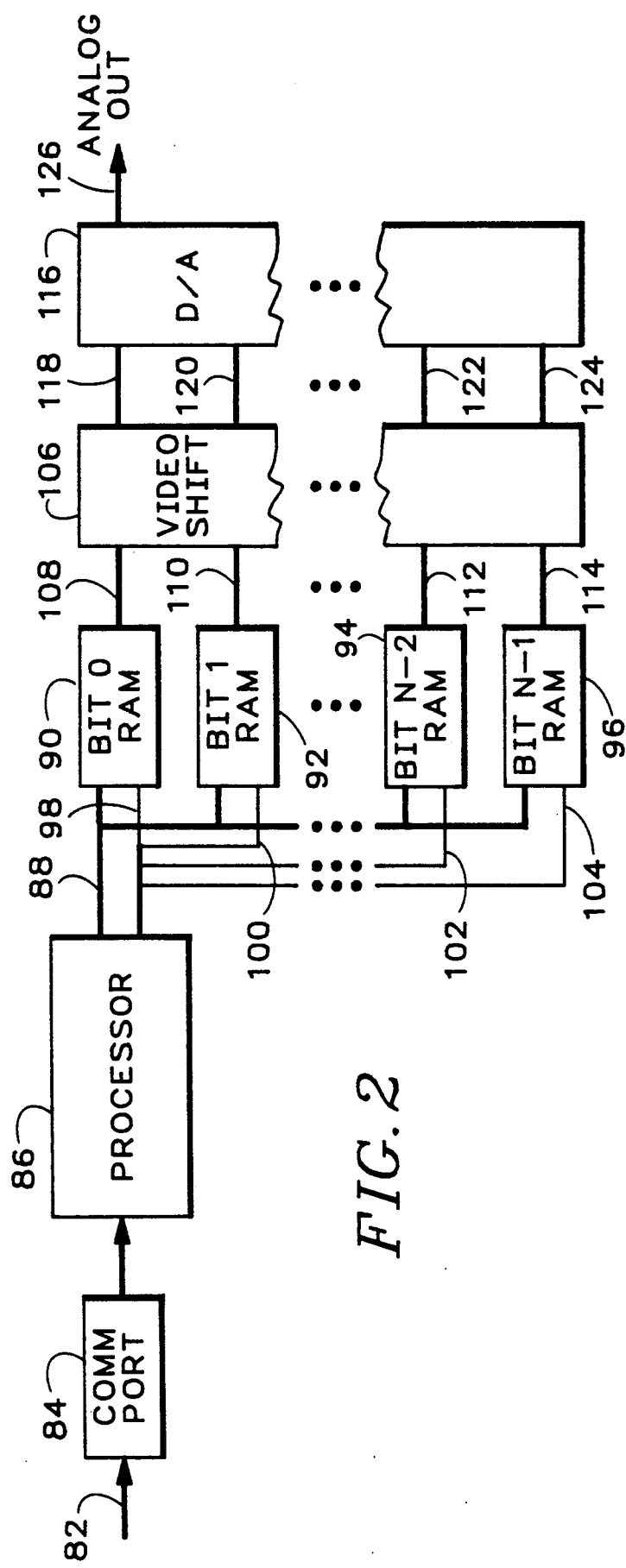
FIG. 2 is a block diagram of a system for decompressing data.

Referring to FIG. 2 a block diagram of a system for decompressing data will now be discussed. The illustrated example assumes a video application, but other applications may be contemplated. A communication link 82 carries compressed data to communications port 84, wherein the compressed data is provided to processor 86. Processor 86 has a bit data output line 88 connected to a number of bit RAMs 90, 92, 94 and 96. The number of bit RAMs would be dependent upon the WORDSIZE of decompressed data; N-bit WORDSIZE is assumed in FIG. 2. Processor 86 further comprises write enable lines 98, 100, 102 and 104 which connect, respectively, to the individual bit RAMs 90 through 96. Bit RAMs provide data to video shifter 106 via data lines 108, 110, 112 and 114. The data from video shifter 106 is provided to digital-to-analog converter 116 on data lines 118, 120, 122 and 124 which correspond to bit zero through bit N−1 respectively. The analog output from digital-to-analog converter 116 is provided on line 126. In operation, when a data value is provided on communication link 82, communication port 84 conveys the data to processor 86, which will decode the compressed data, writing appropriate bit zero data to the bit zero RAM, bit one data to the bit one RAM and so on for the other corresponding bit RAMs. Processor 86 selects write enable lines 98 through 104 (in response to the indication from process block 19 of FIG. 3B of which bit number is being transmitted) to enable the appropriate bit RAM when writing the various data bits. The video shifter 106 will successively select data bits as appropriate from each of the N bit RAMs and provide data to the input of digital-to-analog converter 116 (via data lines 118 through 124) wherein an analog output signal is produced representing an original uncompressed input analog signal, for example, the ramp of FIG. 1.

The illustrated embodiment shows run-length encoding, but the current method could be applied to other compression methods as well. For example, using the bit-selection methods of the current invention together with a Limpel-Ziv-Welch compression method would result in improvements over standard LZW compression ratios. Further, while the illustrated embodiment shows input data streams having lengths M which are multiples of the data-word size N, there are simple methods for transmitting a stream of compressed data in which M is not a multiple of N; for example, a header could indicate the total number of samples in the stream, and the receiving system would then use only part of the samples in the last word sent.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method for processing an N-word data sequence from an input data sequence wherein the input data sequence is composed of M-bit data words, M and N being positive integers, the processing method comprising the steps of:
   a. generating an N-bit data word by selecting bit values from a specified bit position in each word of said N-word data sequence; and
   b. repeating step a for each bit position of the M-bit data words until an N-bit data word has been generated for each of the M bits of the N-word data sequence.

2. The method according to claim 1 further comprising the steps of:
   c. Processing a plurality of N-word data sequences from the input data sequence to generate a plurality of N-bit data words for each N-word data sequence according to steps a and b; and
   d. generating a compressed representation of the input data sequence from the N-bit data words.

3. The method according to claim 2 further comprising the step of:
   e. storing said compresses representation.

4. The method according to claim 2 wherein said step of generating the compressed representation comprises the steps of:
   a. comparing a current generated N-bit data word with a previously generated N-bit data word; and
   b. incrementing a repeat count if said current and previously generated N-bit data words are equal.

5. The method according to claim 4 wherein said step of generating the compresses representation further comprises the step of:
   c. generating a repeat sequence if said current and previously generated N-bit data words are not equal.

6. The method according to claim 5 wherein said step of generating the repeat sequence comprises the step of retaining said previously generated N-bit data word a number of times equal to the repeat count if the repeat count is less than a minimum value.

7. The method according to claim 5 wherein said step of generating a repeat sequence comprises the steps of:
   a. generating a repeat indicator if the repeat count is greater than or equal to a minimum value;
   b. retaining said previously generated N-bit data word; and
   c. retaining said repeat count.

8. The method according to claim 5 wherein said step of storing said compressed representation comprises the steps of:
   a. storing a repeat indicator if the repeat count is greater than or equal to a minimum value;
   b. storing the previously generated N-bit data word; and
   c. storing said repeat count if the current and previously N-bit data words are not equal.

9. The method according to claim 5 wherein said step of storing comprises the step of storing the previously generated N-bit data word a number of times equal to the repeat count.

10. A method for compressing an analog signal comprising the steps of:
    a. repeatedly digitizing the analog signal to generate a sequence of digital data values representing said analog signal, said sequence being composed of M-bit data words, M being a positive integer;
    b. generating a sequence of N-bit data words by successively selecting groups of N-word data sequences, for each group selecting bit values from a specified bit position in each data word to generate an N-bit data word and repeating the process for each bit position to produce M N-bit data words for each group, N being a positive integer; and
    c. storing said N-bit data words, said step of storing including the substeps of
       c1. storing a repeat indicator for each sequence of the N-bit data words that are equal when the number of such equal N-bit data words in sequence is greater than or equal to a minimum value;
       c2. storing a representative N-bit data word from the repetitive sequence of equal N-bit data words; and
       c3. storing a count representing the number of times said N-bit data word is repeated in the sequence.

11. A method for compressing an input data sequence wherein the input data sequence is composed of M-bit data words, M being a positive integer, the method comprising the steps of:
    a. generating a sequence of N-bit data words by successively selecting groups of N-word data sequences, for each group selecting bit values from a specified bit position in each data word to generate an N-bit data word and repeating the process for each bit position to produce M N-bit data words for each group, N being a positive integer; and
    b. compressing said N-bit data words, said step of compressing including the substeps of:
       b1. generating a repeat indicator for each sequence of N-bit data words that are equal when the number of such equal N-bit data words is greater than or equal to a minimum value;
       b2. retaining one of said N-bit data words from the sequence of equal N-bit data words; and
       b3. generating a count representing the number of times said N-bit data word is repeated in the sequence 12. The method according to claim 11 further comprising the step of:
    c. generating framing reference data for each of said sequence of N-bit data words.

13. A method for compressing an input waveform into a sequence of compressed data words, wherein said input waveform is in digital form in an array sequence, the method comprising the steps of:
    a. setting a current significant bit indicator to indicate a first significant bit;
    b. setting a current sequence location indicator to a first array sequence range of entries;
    c. setting a repeat count to be zero;
    d. selecting a bit corresponding to said current significant bit indicator from a plurality of array sequence entries in said range of array sequence entries from the current sequence location;
    e. generating a data word from said selected bits;
    f. comparing said data word with a previously generated data word and processing the result of said comparison according to the following;
       f1. incrementing said repeat count if said step of comparing indicates that the data word and previously generated data word are the same;
       f2. otherwise, if the data word and previously generated data word are not the same and said repeat count is greater than zero, saving a repeated sequence, setting said previously generated data word to be equal to said data word and setting said repeat count to be equal to one;
       f3. otherwise, setting said repeat count to be equal to one and setting said previously generated data word to be equal to said data word.

14. The method according to claim 13 further comprising the steps of:
    g. setting the current sequence location indicator to indicate a next range of array sequence entries;
    h. repeating steps e through g until said array sequence has been exhausted;
    i. saving the repeated sequence if said repeat count is greater than zero;
    j. setting said current significant bit indicator to be equal to a next significant bit;
    k. setting said sequence location indicator to said first range of entries; and
    l. repeating steps c-k until the number of significant bits that have been processed equals the number of significant bits in the input data.

15. The method according to claim 14 wherein the step of saving the repeated sequence comprises the substeps of:
    a. if said repeat count is less than a value, storing said previously generated data word a number of times equal to the repeat count;
    b. otherwise, if said repeat count is not less than said value;
       b1. storing a marker indicating compression;

b2. storing said previously generated data word; and b3. storing said repeat count.

16. The method according to claim 15 wherein the step of storing said previously generated data word comprises:

a. if the previously generated data word to be stored is equal to said compression marker or to an elision marker, storing the elision marker; and b. storing the previously generated data word.

* * * * *